(12) United States Patent
Moore

(10) Patent No.: US 6,187,681 B1
(45) Date of Patent: *Feb. 13, 2001

(54) METHOD AND APPARATUS FOR PLANARIZATION OF A SUBSTRATE

(75) Inventor: Scott E. Moore, Meridian, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/172,950

(22) Filed: Oct. 14, 1998

(51) Int. Cl.[7] .................. H01L 21/302; H01L 21/461
(52) U.S. Cl. ............................. 438/691; 438/692
(58) Field of Search ................ 451/314, 388, 451/288, 258, 463, 514, 515, 532, 533; 438/691, 692, 693

(56) References Cited

U.S. PATENT DOCUMENTS

| | | | |
|---|---|---|---|
| 4,313,284 | * 2/1982 | Walsh | 451/388 |
| 4,450,652 | * 5/1984 | Walsh | 451/288 |
| 5,154,021 | 10/1992 | Bombardier et al. | 156/636 |
| 5,245,794 | 9/1993 | Salugsugan | 51/165.74 |
| 5,299,393 | 4/1994 | Chandler et al. | 51/272 |
| 5,399,234 | 3/1995 | Yu et al. | 156/636 |
| 5,413,941 | 5/1995 | Koos et al. | 437/8 |
| 5,456,627 | 10/1995 | Jackson et al. | 451/11 |
| 5,624,299 | 4/1997 | Shendon | 451/28 |
| 5,643,053 | 7/1997 | Shendon | 451/28 |
| 5,643,061 | * 7/1997 | Jackson et al. | 451/288 |
| 5,681,215 | 10/1997 | Sherwood et al. | 451/388 |
| 5,820,448 | * 10/1998 | Shamouillian et al. | 451/287 |
| 5,833,519 | 11/1998 | Moore | 451/56 |
| 5,865,666 | * 2/1999 | Nagahara | 438/692 |

* cited by examiner

Primary Examiner—Benjamin L. Utech
Assistant Examiner—Duy-Vu Deo
(74) Attorney, Agent, or Firm—Schwegman, Lundberg, Woessner & Kluth, P.A.

(57) ABSTRACT

Method and apparatus for a chemical-mechanical-polishing (CMP) support pad structure are described. The support pad structure is made with a housing to hold an open-cell material and a fluid. The fluid is supplied in a gaseous and/or a liquid state to affect rigidity of the pad. By controlling rigidity, material removal rates may be directly affected during CMP processing. Moreover, fluid flow through the support pad structure may be regulated to adjust temperature during CMP processing.

36 Claims, 3 Drawing Sheets

US 6,187,681 B1

METHOD AND APPARATUS FOR PLANARIZATION OF A SUBSTRATE

TECHNICAL FIELD OF THE INVENTION

The present invention relates generally to mechanical polishing of a semiconductor substrate, and more particularly to a support pad for use in chemical-mechanical-polishing to planarize a substrate assembly.

BACKGROUND OF THE INVENTION

In the semiconductor industry, a technology known as chemical-mechanical-polishing ("CMP") has been developed. In "CMP," a semiconductor wafer is placed between a polishing pad and a wafer carrier. The wafer carrier is a mechanical device used to provide rotation of and downward pressure on the semiconductor wafer. In this manner, the semiconductor wafer is forcibly held and rotated against the polishing pad. As a result, material is abraded from the surface of the semiconductor wafer in contact with the polishing pad.

Slurry, a liquid chemical composition generally containing particulate, may be dispensed on the polishing pad. The slurry conventionally is chemically active to remove unwanted material from the semiconductor wafer. This chemical activity may be changed during CMP processing. The slurry particulate facilitates abrasion. Alternatively, the semiconductor wafer is polished without slurry by using a "fixed-abrasive polishing pad." A "fixed-abrasive polishing pad" has protrusions formed on it to facilitate abrasion. The semiconductor wafer is thus held and rotated against the protrusions on the fixed-abrasive polishing pad.

Aside from removing unwanted material, CMP may be used to planarize a surface of a semiconductor wafer. A uniform planar surface is important for subsequent lithographic processing of the semiconductor wafer, mainly due to depth of focus limitations of lithographic equipment. Accordingly, to achieve a substantially uniformly planar surface, it is important to apply pressure uniformly. A problem has been a lack of uniform pressure resulting in a non-uniform planar surface (e.g., a wedge-like shape).

One approach to achieve greater pressure uniformity has been to place an underpad below the polishing pad. The underpad has more give than the polishing pad, and thus it distributes downward force from the wafer carrier more uniformly. However, conditions, such as temperature, applied force, and friction, change during CMP, and an underpad is not able to compensate for these changes.

Another approach to achieve a more uniform downward force has been to use a wafer carrier having multiple bellows located between a wafer carrier housing and a wafer carrier base, as is described in U.S. Pat. 5,681,215 to Sherwood et al. As the semiconductor wafer is held between the polishing pad and the wafer carrier base, by pressurizing bellows against the wafer carrier housing, force is directed onto the wafer carrier base, which in turn pushes down on the semiconductor wafer. As each bellows may be separately pressurized, downward force is supposedly adjustable from location to location to improve uniformity; however, Sherwood et al is a mechanically complicated approach.

Therefore, it would be desirable to have a CMP apparatus that is less mechanically complicated than Sherwood et al. but allows for rigidity adjustment unlike present day underpads. Furthermore, it would be desirable to have a CMP apparatus that is a disposable item like an underpad.

SUMMARY OF THE INVENTION

The present invention provides method and apparatus for CMP with a support pad to provide a more uniform application of force to polish a semiconductor substrate. Such a support pad is formed with a housing. The housing defines a volume in which an opencell material, disposed in the volume, is coupled to the housing to limit deformation of the volume. A fluid is disposed in the volume to affect rigidity of the support pad. The fluid may be in a gaseous and/or a liquid state and may be pressurized.

The housing may be attached to or in contact with a CMP wafer carrier, a CMP platen, and/or a CMP polishing pad. Such a CMP wafer carrier, platen, and/or pad may be used in combination with the housing in defining a volume in which an open-cell material and fluid is contained. Moreover, inlet and outlet tubes may be employed for providing the fluid in and out of the volume. Such ingress and egress of fluid may be used for thermal control. Baffling or webbing may be located within the volume to regulate fluid flow, to maintain pressurization, and/or to limit volume deformation.

A support pad in accordance with the present invention may be a sealed unit to better cope with a harsh CMP environment; such a support pad may easily be removed and replaced. Moreover, a sealed pad may be pressurized to a desired level for a CMP operation. Alternatively, one or more tubes may be employed for in situ maintenance and/or adjustment of support pad rigidity.

BRIEF DESCRIPTION OF THE DRAWING(S)

Features and advantages of the present invention will become more apparent from the following detailed description of the preferred embodiment(s) described below in detail with reference to the accompanying drawings where:

Figure 1:
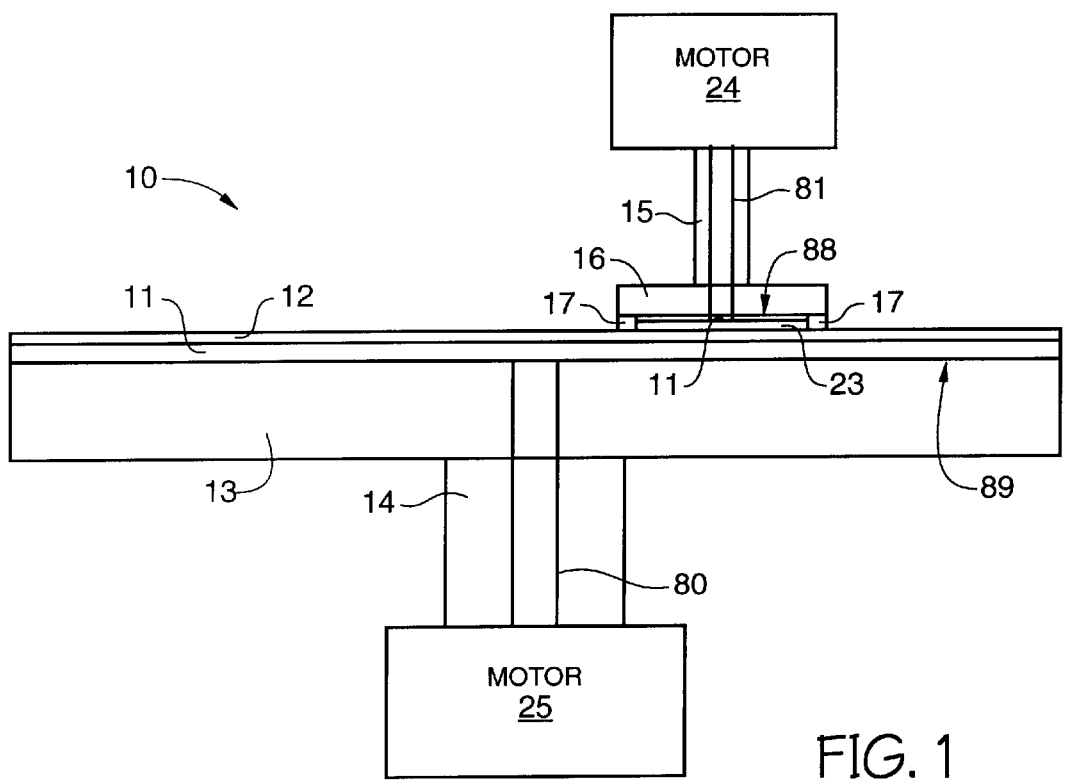
FIG. 1 is a cross-sectional view of an exemplary portion of a CMP systems in accordance with the present invention.

Reference numbers refer to the same or equivalent parts of embodiment(s) of the present invention throughout the several figures of the drawing.

DETAILED DESCRIPTION OF THE PREFERRED EMBODIMENT(S)

Referring to FIG. 1, there is shown a cross-sectional view of an exemplary portion of a CMP system 10. CMP system 10 comprises motors 24 and 25, support pads 11, drive shafts 14 and 15, polishing pad 12, platen 13, wafer carrier housing 16, and retaining ring 17. Motors 24 and 25 may be employed to rotatively drive shafts 15 and 14, respectively. Drive shafts 14 and 15 may be hollow, such that cavities, as indicated by dashed lines 80 and 81, may house tubing to transport fluids to and from support pads 11, as will become apparent.

A support pad 11, in accordance with the present invention, may be located below polishing pad 12, and/or between wafer carrier 16 and substrate assembly 23. By "substrate assembly," it should be understood to include a bare substrate or wafer, as well as a substrate having one or more layers and/or features formed thereon and/or therein.

Several embodiments of support pads I are explained in more detail below, where it will become apparent that by employing a support pad of the present invention, a substantially uniformly distributed pressure may be obtained.

Figure 2:
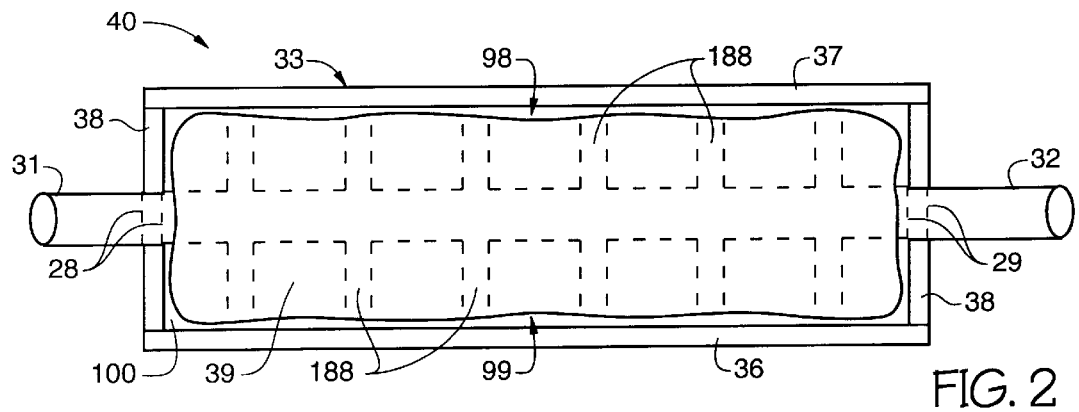
FIG. 2 is a cross-sectional view of an exemplary portion of an embodiment of a support pad structure in accordance with the present invention.

Referring now to FIG. 2, there is shown a cross-sectional view of an exemplary portion of an embodiment of a support pad 40 in accordance with the present invention. Support pad 40 comprises a non-rigid housing 33, filler 39, inlet tube 31 and outlet tube 32.

In defining volume 100, housing 33 comprises upper layer 37, lower layer 36, and at least one outer or side layer 38. Layers 36, 37, and 38 may be made from polycarbonate, polyurethane, or other suitable material. Upper layer 37 includes inner top surface 98, and bottom layer 36 includes inner bottom surface 99. Layers 36 and 37 may be bonded, clamped, fused, glued, epoxied and in like manner attached or coupled to layer 38, filler 39, and/or webbing 68 (shown in FIG. 3) to limit ballooning of volume 100 and/or housing 33. Alternatively, layers 36, 37, and 38 may be integrally formed as one unitized housing 33. Filler 39 may be formed after at least partial formation of housing 33 in order to substantially fill volume 100. Alternatively, filler 39 may be prefabricated for fitting into volume 100. Filler 39 may be formed of an open-cell material. By open-cell material, it is meant a matrix having adjacent, suspended voids ("open-cells"). In accordance with an embodiment of the present invention, matrix with embedded voids is gas or liquid permeable, and more particularly is capable of providing at least one conduit for transmitting a fluid from a proximal surface to a distal surface. Materials used in forming open-cell structures include polymers, monomers, elastomers, carbon, silicon. Some materials for forming open-cell material include polyurethane, polypropylene, polyethylene, polyolefin, polychloroprene, rubber, synthetic-rubber, among others. Each substance may be used in forming a sponge-like material as is well known. An open-cell foam with sufficient rigidity to withstand downward polish force may be employed.

Inlet tube 31 and/or outlet tube 32 may be removed or omitted where support pad 40 has a sealed volume, as indicated by dash lines 28 and 29. For example, inlet tube 31 may be used for dispensing a fluid into volume 100 defined by housing 33. After such dispensing is completed, inlet tube 31 may be sealed (fused, glued, epoxies, bonded, and the like) to form a sealed volume. A sealed volume support pad may be more beneficial for implementations where it is rotated during CMP.

With reference to FIG. 1, hollow drive shafts 14, 15 may meet holes in platen 13 and/or wafer carrier 16, as indicated by dashed lines 80 and 81. Such configurations may be employed at least in part to house one or more tubes 31 and/or 32.

Inlet tube 31 and outlet tube 32 may comprise one or more tubes for transporting fluid to and from volume 100. Furthermore, inlet tube 31 and outlet tube 32 in combination may form a manifold having one or more tubing branches or alternatively open-cell material may be configured to provide a manifold, as illustratively indicated by dashed lines 188.

Figure 3:
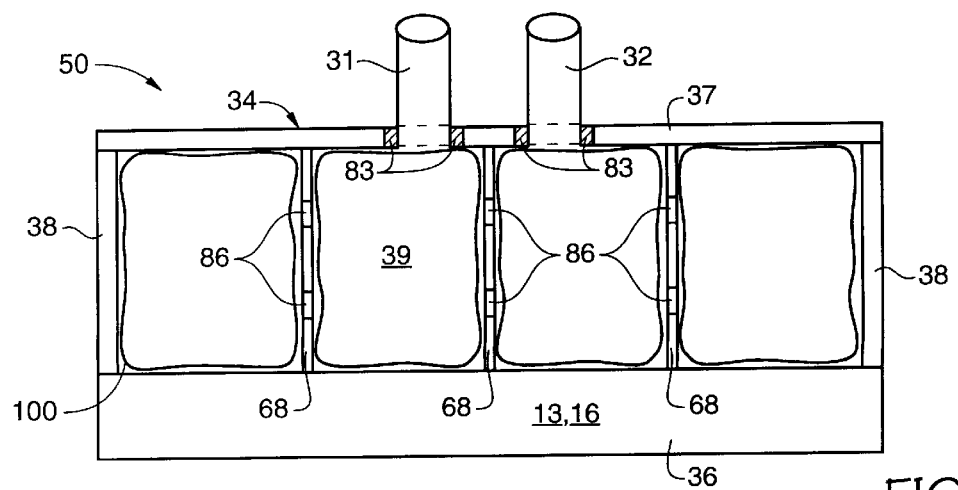
FIG. 3 is a cross-sectional view of an exemplary portion of an alternate embodiment of support pad structure in accordance with the present invention.

Referring to FIG. 3, there is shown a cross-sectional view of an exemplary portion of an alternate embodiment of a support pad 50 in accordance with the present invention. Support pad 50 is similar to support pad 40 of FIG. 2, except bottom layer 36 has been omitted, webbing 68 has been added to form baffles, and tubes 31 and 32 have been reoriented. Bottom layer 36 may be omitted in place of top surface 89 of platen 13 and/or bottom surface 88 of wafer carrier 16 (shown in FIG. 1). Outer layer 38 is attached to platen layer 13 and/or wafer carrier 16 depending on configuration to be employed. Webbing 68, which may have passages 86, may be used to limit deformation of volume 100, to regulate or direct fluid flow, and/or to maintain pressurization of filler 39. Tubes 31 and 32 may be at least partially housed in either drive shaft 14 or 15 (shown in FIG. 1). Seals 83 may be employed to limit or prevent fluid leakage.

Figure 4:
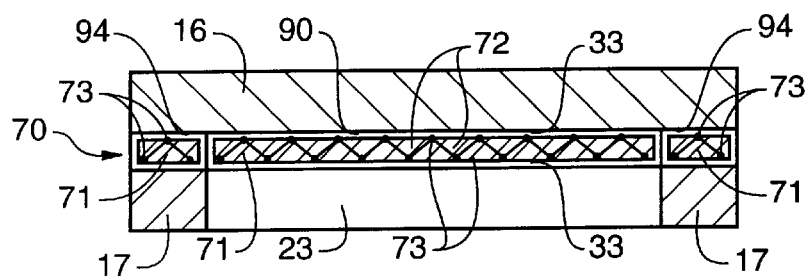
FIG. 4 is a cross-sectional view of an exemplary portion of a wafer carrier assembly in accordance with the present invention.

Referring to FIG. 4, there is shown a cross-sectional view of an exemplary portion of an embodiment of a wafer carrier assembly 70 in accordance with the present invention. Wafer carrier assembly 70 includes an alternate embodiment of a sealed support pad 90 of the present invention. Open-cell foam 71 may have a skin forming at least a portion of housing 94 of sealed support pad 90. Alternatively, open-cell foam 71 may be laminated at least in part to form at least a portion of housing 94. Also, corrugated webbing 72 may be used to form baffles to limit deformation of housing 94. Webbing 72 may be attached to interior surfaces of housing 94 at one or more contact points 73.

Figure 5:
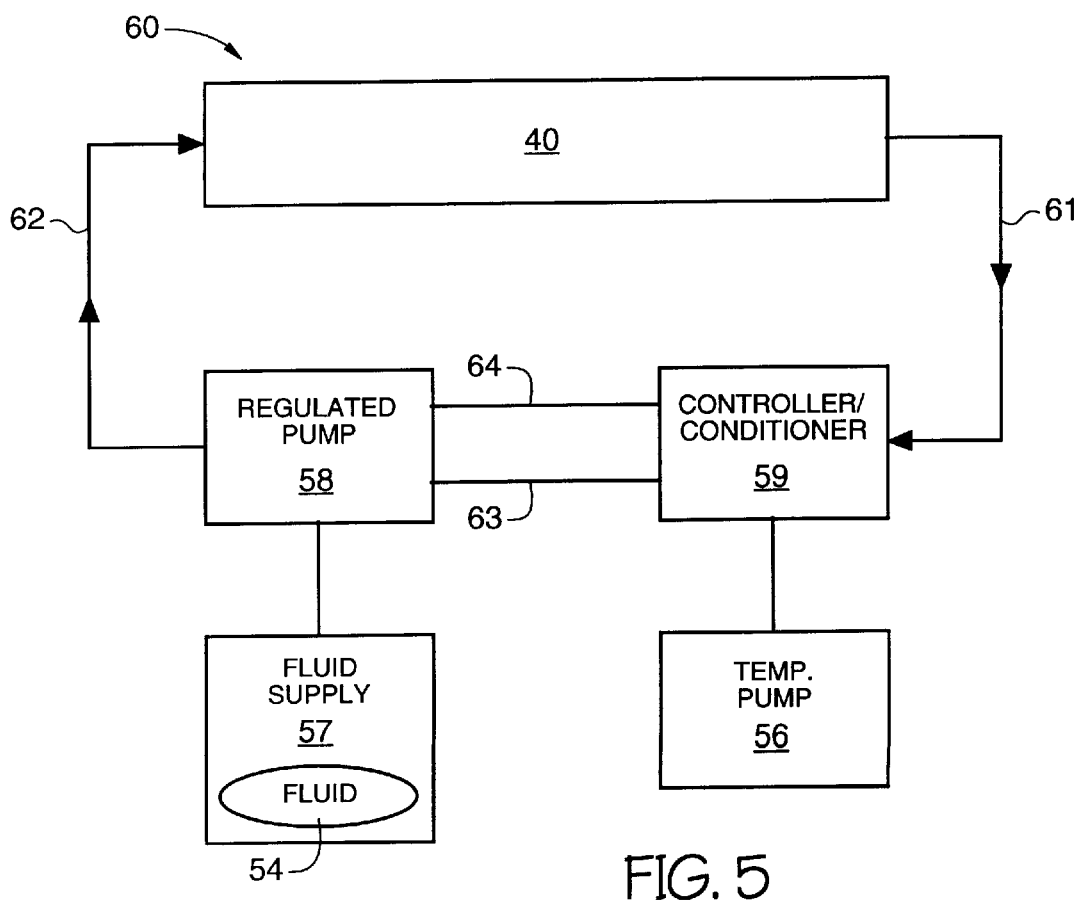
FIG. 5 is a block diagram of an exemplary portion of an embodiment of a fluid control system in accordance with the present invention.

Referring now to FIG. 5, there is shown a block diagram of an exemplary portion of an embodiment of fluid control system 60 for use with support pad 40 in accordance with the present invention. Fluid is supplied from fluid supply 57 to pump 58. Fluid is pumped from pump 58 along in-feed tubing 62 to support pad 40, e.g., through inlet tube 31 (shown in FIG. 2).

Exiting fluid flows from support pad 40, through out-feed tubing 61 to controller-conditioner 59. Controller-conditioner 59 may be used to monitor fluid pressure and/or temperature. If temperature is too high or too low, controller-conditioner 59 may divert fluid to temperature pump 56 in order to increase or decrease temperature of fluid 54. In this manner, support pad 40 may be employed at least in part for temperature control during CMP. Controller-conditioner 59 in electrical communication with regulated pump 58 via path 63 may regulate pressure of fluid supplied to support pad 40. Pressure may then be referenced to absolute pressure, atmospheric pressure, or polish downward force. In one embodiment, pressure ranges from approximately 1 to 100 p.s.i. However, while not wishing to be bound by any particular theory, it is believed that the pressure should be selected to be greater than the polish downward force being applied. As CMP downward force is typically in a range of approximately 1 to 10 p.s.i., a pressure in a range of approximately 2 to 20 p.s.i. may be employed therefor. Tubing 64 allows fluid 54 transfer between controller/conditioner 59 and pump 58.

Notably, the present invention may also be employed in a single-ended system. In which system, in-feed tubing 62 is used for ingress and egress of fluid 54 to support pad 40, and out-feed tubing 61 is omitted.

Support pad 40 rigidity may be controlled at least in part by pressurization of volume 100 (shown in FIG. 2) by fluid 54. Rigidity of support pad 40 may also be effected by the type of fluid selected. Fluid 54 may be in a liquid state, a colloidal (gelatinous) state, and/or a gaseous state. Moreover, gas may be introduced and at least partially dissolved in a liquid to adjust compressibility. Also, a support pad 11 (shown in FIG. 1) may be pressurized to volumetrically expand to maintain substrate assembly 23 in contact with CMP pad 12 for polishing.

In accordance with the present invention, during CMP, support pad rigidity may be controlled to affect material removal rate. Generally, a more rigid support pad will aid removal of more material than a less rigid support pad. Also, by controlling fluid flow through a support pad, temperature may be adjusted during CMP processing, including adjustment. Also, a support pad may be pressurized to compensate for changes in a downwardly directed force used in polishing a substrate assembly.

The present invention has been particularly shown and described with respect to certain preferred embodiment(s). It should be readily apparent to those of ordinary skill in the art that various changes and modifications in form and detail may be made without departing from the spirit and scope of the present invention as set forth in the appended claims.

What is claimed is:

1. In a chemical-mechanical-polishing system having a platen and a polishing pad, a method for thermal control during substrate assembly planarization, comprising:
   providing a pad structure, said pad structure having a housing, said housing having an inlet tube and an outlet tube, said pad structure having a sponge-like material disposed within said housing;
   locating said pad structure between said polishing pad and said platen;
   providing fluid to said housing through said inlet tube;
   removing said fluid from said housing through said outlet tube;
   monitoring temperature of said fluid; and
   adjusting temperature of said fluid during said planarization.

2. In a chemical-mechanical-polishing system having a platen and a polishing pad, a method for adjusting responsiveness of said polishing pad during planarization of a substrate assembly, comprising:
   providing a pad structure, said pad structure having a housing, said housing having an inlet tube and an outlet tube, said pad structure having a sponge-like material disposed within said housing;
   locating said pad structure between said polishing pad and said platen;
   providing fluid to said housing through said inlet tube;
   removing said fluid from said housing through said outlet tube;
   monitoring pressure of said fluid; and
   adjusting pressure of said fluid during said planarization.

3. The method of claim 2, wherein said pressure is maintained in a range of approximately 1 to 100 p.s.i.

4. The method of claim 2, wherein said pressure is maintained in a range of approximately 2 to 20 p.s.i.

5. The method of claim 2, wherein said pressure is at or above a polishing force pressure.

6. The method of claim 5, wherein said polishing force pressure is in a range of approximately 1 to 10 p.s.i.

7. In a chemical-mechanical-polishing system having a wafer carrier, a method for thermal control during polishing, comprising:
   providing a pad structure, said pad structure having a housing, said housing having an inlet tube and an outlet tube, said pad structure having a sponge-like material disposed within said housing;
   locating said pad structure in operative proximity to said wafer carrier;
   providing fluid to said housing through said inlet tube;
   removing said fluid from said housing through said outlet tube;
   monitoring temperature of said fluid; and
   adjusting temperature of said fluid during said polishing.

8. In a chemical-mechanical-polishing system having a wafer carrier, a method for adjusting responsiveness of a polishing pad during planarization of a substrate assembly, comprising:
   providing a pad structure, said pad structure having a housing, said housing having an inlet tube and an outlet tube, said pad structure having a sponge-like material disposed within said housing, locating said pad structure in operative proximity to said wafer carrier;
   providing fluid to said housing through said inlet tube;
   removing said fluid from said housing through said outlet tube;
   monitoring pressure of said fluid; and
   adjusting pressure of said fluid during said planarization.

9. The method of claim 8, wherein said pressure is in a range of approximately 1 to 100 p.s.i.

10. The method of claim 8, wherein said pressure is in a range of approximately 2 to 20 p.s.i.

11. The method of claim 8, wherein said pressure is at or above a polishing force pressure.

12. The method of claim 11, wherein said polishing force pressure is in a range of approximately 1 to 10 p.s.i.

13. In a chemical-mechanical-polishing system having a platen and a polishing pad, a method for thermal control during polishing of a substrate assembly, comprising:
   providing at least one support pad structure having a housing;
   locating said at least one support pad structure in near proximity to said substrate assembly for thermal conductivity thereto;
   providing a tubing operatively coupled with the housing to deliver fluid thereto, the tubing being located in a hollow drive shaft rotatably driven by a motor;
   providing a fluid to and from said housing by the tubing, the rigidity of the housing being effected by the fluid; and
   varying temperature of said fluid during said polishing.

14. The method of claim 13 wherein providing at least one support pad structure having a housing comprises providing a support pad structure having a housing, the support pad structure being located above the platen and below the polishing pad.

15. The method of claim 13 wherein providing at least one support pad structure having a housing comprises providing a support pad structure having a housing, the support pad structure being located adjacent the substrate assembly.

16. The method of claim 13 wherein providing at least one support pad structure having a housing comprises providing a first support pad structure having a housing and being located above the platen and below the polishing pad, and providing a second support pad structure having a housing and being located adjacent the substrate assembly.

17. In a chemical-mechanical-polishing (CMP) system having a platen and a polishing pad, a method for adjusting responsiveness of said CMP system during polishing of a substrate assembly, comprising:
   providing at least one support pad structure having a housing;
   providing a tubing operatively coupled with the housing to deliver fluid thereto, the tubing being located in a hollow drive shaft rotatably driven by a motor;

providing a fluid to and from said housing by the tubing, the rigidity of the housing being effected by the fluid; and varying pressure of said fluid to said housing during said polishing.

18. The method of claim 17 wherein providing at least one support pad structure having a housing comprises providing a support pad structure having a housing, the support pad structure being located above the platen and below the polishing pad.

19. The method of claim 17 wherein providing at least one support pad structure having a housing comprises providing a support pad structure having a housing, the support pad structure being located adjacent the substrate assembly.

20. The method of claim 17 wherein providing at least one support pad structure having a housing comprises providing a first support pad structure having a housing and being located above the platen and below the polishing pad, and providing a second support pad structure having a housing and being located adjacent the substrate assembly.

21. In a chemical-mechanical-polishing system having a platen and a polishing pad, a method for thermal influence on a substrate assembly, comprising:

providing at least one support pad structure having a housing;

locating said at least one support pad structure in near proximity to said substrate assembly for thermal conductivity thereto;

providing a tubing operatively coupled with the housing to deliver fluid thereto, the tubing being located in a hollow drive shaft rotatably driven by a motor;

providing a fluid to and from said housing by the tubing, the rigidity of the housing being effected by the fluid; and varying temperature of said fluid.

22. The method of claim 21 wherein providing at least one support pad structure having a housing comprises providing a support pad structure having a housing, the support pad structure being located above the platen and below the polishing pad.

23. The method of claim 21 herein providing at least one support pad structure having a housing comprises providing a support pad structure having a housing, the support pad structure being located adjacent the substrate assembly.

24. The method of claim 21 wherein providing at least one support pad structure having a housing comprises providing a first support pad structure having a housing and being located above the platen and below the polishing pad, and providing a second support pad structure having a housing and being located adjacent the substrate assembly.

25. In a chemical-mechanical-polishing (CMP) system, a method for adjusting responsiveness of said CMP system for polishing a substrate assembly, comprising:

providing at least one support pad structure having a housing;

providing a tubing operatively coupled with the housing to deliver fluid thereto, the tubing being located in a hollow drive shaft rotatably driven by a motor;

providing a fluid to and from said housing by the tubing, the rigidity of the housing being effected by the fluid; and varying pressure of said fluid to said housing.

26. The method of claim 25 wherein providing at least one support pad structure having a housing comprises providing a support pad structure having a housing, the support pad structure being located above the platen and below the polishing pad.

27. The method of claim 25 herein providing at least one support pad structure having a housing comprises providing a support pad structure having a housing, the support pad structure being located adjacent the substrate assembly.

28. The method of claim 25 wherein providing at least one support pad structure having a housing comprises providing a first support pad structure having a housing and being located above the platen and below the polishing pad, and providing a second support pad structure having a housing and being located adjacent the substrate assembly.

29. In a chemical-mechanical-polishing system having a platen and a polishing pad, a method for thermal control during polishing of a substrate assembly, comprising:

providing a pad structure having a non-rigid housing;

locating said pad structure in near proximity to said substrate assembly for thermal conductivity thereto;

providing fluid to and from said housing; and varying temperature of said fluid during said polishing.

30. The method of claim 29, wherein the housing defines a volume having an open-cell material disposed therein.

31. In a chemical-mechanical-polishing (CMP) system having a platen and a polishing pad, a method for adjusting responsiveness of said CMP system during polishing of a substrate assembly, comprising:

providing a pad structure having a non-rigid housing;

providing fluid to and from said housing; and varying pressure of said fluid to said housing during said polishing.

32. The method of claim 31, wherein the housing defines a volume having an open-cell material disposed therein.

33. In a chemical-mechanical-polishing system having a platen and a polishing pad, a method for thermal influence on a substrate assembly, comprising:

providing a pad structure having a non-rigid housing:

locating said pad structure in near proximity to said substrate assembly for thermal conductivity thereto;

providing fluid to and from said housing; and varying temperature of said fluid.

34. The method of claim 33, wherein the housing defines a volume having an open-cell material disposed therein.

35. In a chemical-mechanical-polishing (CMP) system, a method for adjusting responsiveness of said CMP system for polishing a substrate assembly, comprising:

providing a pad structure having a non-rigid housing;

providing fluid to and from said housing; and varying pressure of said fluid to said housing.

36. The method of claim 35, wherein the housing defines a volume having an open-cell material disposed therein.

\* \* \* \* \*

UNITED STATES PATENT AND TRADEMARK OFFICE
CERTIFICATE OF CORRECTION

PATENT NO. : 6,187,681 B1
DATED : February 13, 2001
INVENTOR(S) : Scott E. Moore It is certified that error appears in the above-identified patent and that said Letters Patent is hereby corrected as shown below:

Column 2,
Line 3, delete "opencell" and insert -- open cell --, therefor.
Line 34, delete "systems" and insert -- system --, therefor.

Column 3,
Line 3, delete "pads I" and insert -- pads 11 --, therefor.
Line 47, delete "epoxies" and insert -- epoxied --, therefor.

Column 6,
Line 12, delete "housing," and insert -- housing; --, therefor.
Line 12, insert -- ¶ -- before "locating".

Signed and Sealed this

Eleventh Day of December, 2001

*Attest:*

*Attesting Officer*

NICHOLAS P. GODICI
*Acting Director of the United States Patent and Trademark Office*